(12) United States Patent
Ikezawa et al.

(10) Patent No.: US 7,978,310 B2
(45) Date of Patent: Jul. 12, 2011

(54) PROJECTION OPTICAL SYSTEM, EXPOSURE SYSTEM, AND EXPOSURE METHOD

(75) Inventors: Hironori Ikezawa, Fukaya (JP); Yuji Kudo, Shinagawa-ku (JP); Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/719,455

(22) Filed: Mar. 8, 2010

(65) Prior Publication Data

US 2010/0159401 A1    Jun. 24, 2010

Related U.S. Application Data

(63) Continuation of application No. 11/645,041, filed on Dec. 26, 2006, now Pat. No. 7,710,653, which is a continuation of application No. PCT/JP2006/300587, filed on Jan. 18, 2006.

(30) Foreign Application Priority Data

Jan. 28, 2005   (JP) .................................. 2005-020979

(51) Int. Cl.
    *G03B 27/54*    (2006.01)
    *G03B 27/32*    (2006.01)
(52) U.S. Cl. ............................ 355/77; 355/67; 355/71
(58) Field of Classification Search ................ 359/242, 359/252, 443, 446, 448–450, 457, 618, 738–740, 359/811, 815; 355/18, 53, 67–71, 75–76, 355/77; 250/492.2, 492.23
    See application file for complete search history.

(56) References Cited

U.S. PATENT DOCUMENTS

| 2004/0109237 A1 | 6/2004 | Epple et al. |
| 2006/0203218 A1 | 9/2006 | Shirai et al. |
| 2007/0201011 A1 | 8/2007 | Kokubun et al. |

FOREIGN PATENT DOCUMENTS

| EP | 1 486 827 A2 | 12/2004 |
| EP | 1 670 038 A1 | 6/2006 |
| JP | A-10-303114 | 11/1998 |
| JP | A-2004-191920 | 7/2004 |
| JP | A-2004-205698 | 7/2004 |
| JP | A-2004-207711 | 7/2004 |

(Continued)

OTHER PUBLICATIONS

European Search Report issued Mar. 28, 2011 in European Patent Application No. 06711856.2.

*Primary Examiner* — Ricky L Mack
*Assistant Examiner* — Mahidere S Sahle
(74) *Attorney, Agent, or Firm* — Oliff & Berridge, PLC

(57) ABSTRACT

A liquid immersion type projection optical system that can stably prevent the outflow of immersion liquid into inside of an optical system and can maintain good imaging performance. In the projection optical system of the present invention, an optical path between a light transmitting member (Lp) disposed closest to a second surface (W) side and the second surface is filled with a liquid (Lm1) having a refractive index greater than 1.1, and a light shielding film (36) for shielding the passing of light is formed on the side surfaces (41, 42) of the light transmitting member. When D is a space between the second surface and the light shielding film, $\Theta$ is a maximum incident angle of an image forming beam which reaches the second surface, and Ym is a maximum image height on the second surface, the condition of $0.25 < D/Ym \times \tan\Theta < 1.7$ is satisfied.

14 Claims, 12 Drawing Sheets

FOREIGN PATENT DOCUMENTS

| | | |
|---|---|---|
| JP | A-2004-259966 | 9/2004 |
| JP | A-2005-268741 | 9/2005 |
| WO | WO 99/49504 A1 | 9/1999 |
| WO | WO 2004/019128 A2 | 3/2004 |
| WO | WO 2004/107048 A2 | 12/2004 |

TANGENTIAL      SAGITAL

Y=13.4mm

Y=0.0mm

PROJECTION OPTICAL SYSTEM, EXPOSURE SYSTEM, AND EXPOSURE METHOD

CROSS REFERENCE TO RELATED APPLICATIONS

This is a Continuation of application Ser. No. 11/645,041, filed Dec. 26, 2006, which is a Continuation of PCT Application PCT/JP2006/300587, filed Jan. 18, 2006, which claims the benefit of U.S. Provisional 60/754,273, filed on Dec. 29, 2005. The disclosures of the prior applications are hereby incorporated herein by reference in their entirety.

BACKGROUND OF THE INVENTION

1. Technical Field

The present invention relates to a projection optical system, exposure apparatus and exposure method, and more particularly to a projection optical system suitable for an exposure apparatus used for manufacturing micro devices, such as semiconductor devices and liquid crystal display devices, in a photolithography step.

2. Background Art

In a photolithography process for manufacturing semiconductor devices, an exposure apparatus which projects and exposes a pattern image of a mask (or a reticle) onto a photosensitive substrate (e.g. wafer or glass plate on which photoresist is coated) via a projection optical system has been used. For the exposure apparatus, the resolution required for the projection optical system is increasing more and more as the degree of integration of semiconductor devices improves.

In order to satisfy the demand for the resolution of the projection optical system, the wavelength λ, of the illumination light (exposure light) must be decreased, and the numerical aperture NA at the image side of the projection optical system must be increased. Specifically, the resolution of the projection optical system is given by k·λ/NA (k is a process coefficient). The numerical aperture NA at the image side is given by n·sin θ, where n is a refractive index of the medium (normally a gas, such as air) between the projection optical system and the photosensitive substrate, and θ is a maximum incident angle to the photosensitive substrate.

When it is attempted to increase the numerical aperture at the image side by increasing the maximum incident angle θ, the incident angle to the photosensitive substrate and the emission angle from the projection optical system increase, and reflection loss on the optical loss increases, so a large effective numerical aperture at the image side cannot be secured. Therefore an immersion technology for attempting an increase of the numerical aperture at the image side by filling a medium, such as liquid, having a high refractive index in an optical path between the projection optical system and the photosensitive substrate, is known (e.g. Patent Document 1).

Patent Document 1: International Publication No. WO2004/019128 Pamphlet

DISCLOSURE OF THE INVENTION

Problems to be Solved by the Invention

In this immersion type projection optical system, a seal member for preventing the outflow of the immersion liquid into inside of the optical system and to the wafer stage (photosensitive substrate stage) side must be installed adjacent to the optical elements contacting the immersion liquid. Normally this type of seal member is made from a material which easily deteriorates by the irradiation of exposure light, such as water repellent fluororesin. Therefore the seal member is disposed outside the effective region (region where effective image forming beam passes through) of the optical element, so as not to be exposed to the irradiation of exposure light directly.

However in the projection optical system, flare lights exist due to multiple reflection among the optical surface (lens surface), wafer surface and mask face, and these flare lights may possibly reach outside the effective region (clear aperture) of the optical element. In this case, the seal member deteriorates by light irradiation, and the outflow of immersion liquid into inside of the projection optical system and to the wafer stage side cannot be prevented. As a result, an anti-reflection film on the optical surface deteriorates, which causes the deterioration of the imaging performance (general optical performance) of the projection optical system.

With the foregoing in view, it is an object of the present invention to provide an immersion type projection optical system which stably prevents the outflow of immersion liquid into inside of the optical system, and maintains a good image forming performance. It is another object of the present invention to provide a stable exposure apparatus and exposure method for projecting and exposing micro-patterns at high precision using a high resolution immersion type project optical system which prevents the outflow of immersion liquid into inside of the optical system and to the photosensitive substrate stage side stably, and maintains a good imaging performance.

Means of Solving the Problems

To solve these problems, a first embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, and a light shielding film for shielding the passing of light is formed on at least one surface out of a surface at the first surface side and a surface at the second surface side of the light transmitting member.

A second embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, a light shielding film for shielding light is formed on a side surface of the light transmitting member, and a condition of $0.25 < D/Ym \times \tan\theta < 1.7$ is satisfied, where D is a space between the second surface and the light shielding film, θ is a maximum incident angle of an image forming beam which reaches the second surface, and Ym is a maximum image height on the second surface.

A third embodiment of the present invention is a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, and a light shielding film for shielding the passing of light is formed in a non-tapered portion of a side surface of the light transmitting member.

A fourth embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, the projection optical system comprises a seal member for preventing the outflow of the liquid from the optical path between the light transmitting member and the second surface to the outside, formed contacting the light transmitting member, and wherein a transmitted wavefront change quantity S of the light transmitting member when the light transmitting member and the seal member contact satisfies S<7 m λ RMS. Provided that in the case where a plurality of seal members are prepared for the light transmitting member, if the transmitted wavefront change quantity when one of the plurality of seal members contacts the light transmitting member is s, a standard deviation of the transmitted wavefront change quantity s for the plurality of seal members is S.

A fifth embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, and the projection optical system comprises liquid prevention means for preventing the entry of the liquid into inside of the projection optical system, and deterioration reduction means for reducing the deterioration of the liquid prevention means, the deterioration reduction means being formed on at least one surface out of a surface at the first surface side and a surface at the second surface side of the light transmitting member.

A sixth embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, the projection optical system comprises liquid prevention means for preventing the entry of the liquid into inside of the projection optical system, and deterioration reduction means for reducing the deterioration of the liquid preventing means, the deterioration reduction means being formed on a side surface of the light transmitting member, and wherein the condition of $0.25 < D/Ym \times \tan\theta < 1.7$ is satisfied, where D is a space between the second surface and the deterioration reduction means, θ is a maximum incident angle of an image forming beam which reaches the second surface, and Ym is a maximum image height on the second surface.

A seventh embodiment of the present invention provides a projection optical system for projecting an image on a first surface to a second surface, wherein an optical path between a light transmitting member disposed closest to the second surface side and the second surface is filled with liquid having a refractive index greater than 1.1 when a refractive index of gas in an optical path of the projection optical system is 1, the projection optical system comprises liquid prevention means for preventing the entry of the liquid into inside of the projection optical system, and deterioration reduction means for reducing the deterioration of the liquid prevention means, the deterioration reduction means being formed in a non-tapered portion of a side surface of the light transmitting member.

An eighth embodiment of the present invention provides a projection optical system for projecting an image on a first surface to a second surface, comprising a light transmitting member disposed closest to the second surface side, and a second light transmitting member disposed adjacent to the light transmitting member, wherein an optical path between the light transmitting member and the second surface is filled with a first liquid having a refractive index greater than 1.1, and an optical path between the light transmitting member and the second light transmitting member is filled with a second liquid having a refractive index greater than 1.1 when a refractive index of gas in an optical path of the projection optical system is 1, the projection optical system further comprising liquid prevention means for preventing the entry of the liquid into inside of the projection optical system, and deterioration reduction means for reducing the deterioration of the liquid prevention means, wherein the deterioration reduction means is formed on at least one surface out of a surface at the first surface side and a surface at the second surface side of at least one member of the light transmitting member and the second light transmitting member.

A ninth embodiment of the present invention provides a projection optical system for projecting an image on a first surface to a second surface, comprising a light transmitting member disposed closest to the second surface side, and a second light transmitting member disposed adjacent to the light transmitting member, wherein an optical path between the light transmitting member and the second surface is filled with a first liquid having a refractive index greater than 1.1, and an optical path between the light transmitting member and the second light transmitting member is filled with a second liquid having a refractive index greater than 1.1 when a refractive index of gas in an optical path of the projection optical system is 1, the projection optical system further comprising liquid prevention means for preventing the entry of the liquid into inside of the projection optical system, and the deterioration of the liquid prevention means, wherein the deterioration reduction means is formed in a non-tapered portion of a side surface of the light transmitting member.

A tenth embodiment of the present invention provides an exposure apparatus, comprising the projection optical system according to the first embodiment to the ninth embodiment for projecting an image of a predetermined pattern which is set on the first surface to the photosensitive substrate which is set on the second surface.

The eleventh embodiment of the present invention provides a manufacturing method for a device comprising an exposure step of exposing the predetermined pattern onto the photosensitive substrate using the exposure apparatus according to the tenth embodiment, and a development step of developing said photosensitive substrate after said exposure step.

A twelfth embodiment of the present invention provides an exposure method for projecting and exposing a predetermined pattern which is set on the first surface onto a photosensitive substrate which is set on the second surface via the projection optical system according to the first embodiment to the ninth embodiment.

Effect of the Invention

In an immersion type projection optical system according to a typical embodiment of the present invention, liquid prevention means, such as a seal member, for preventing the outflow of the immersion liquid to the outside, is installed, and a light shielding film for shielding flare lights which reach this seal member (liquid prevention means) is formed. As a result, the seal member (liquid prevention means) substantially does not deteriorate by the irradiation of the flare light, and the deterioration of the image forming performance of the projection optical system, due to the outflow of the immersion liquid, substantially does not occur.

In other words, according to the projection optical system of the present invention, the outflow of the immersion liquid into inside of the optical system can be stably prevented and a good image forming performance can be maintained. In the exposure apparatus and exposure method of the present invention, a high precision immersion type projection optical system which can prevent the outflow of immersion liquid into inside of the optical system and to the photosensitive substrate stage side and maintain a good image forming performance is used, so micro-patterns can be projected and exposed accurately and stably, and therefore good microdevices can be manufactured accurately and stably.

BEST MODE FOR CARRYING OUT THE INVENTION

Figure 1:
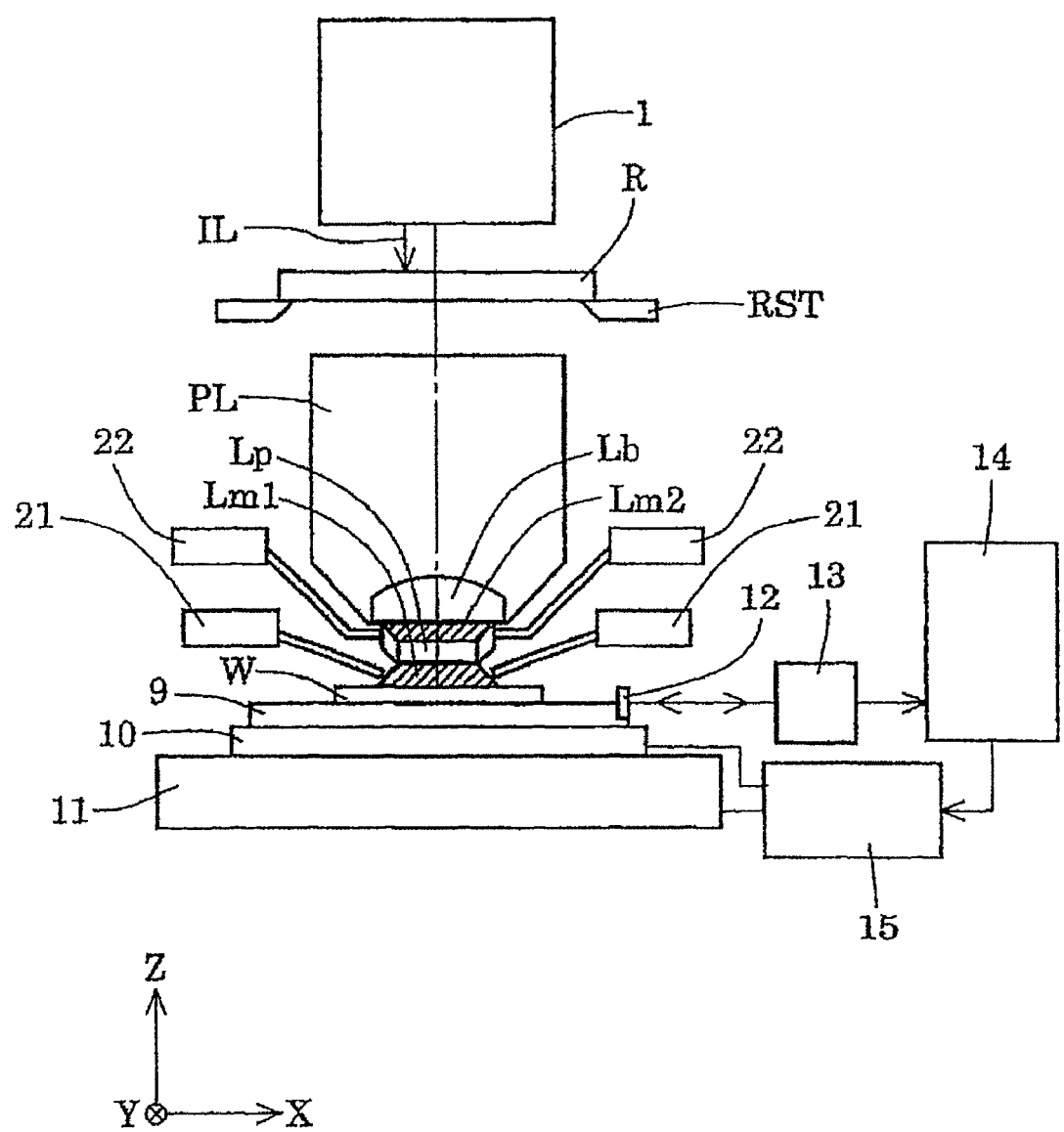
FIG. 1 is a diagram showing a general configuration of the exposure apparatus according to an embodiment of the present invention.

Embodiments of the present invention will now be described with reference to the accompanying drawings. FIG. 1 is a diagram depicting a general configuration of an exposure apparatus according to an embodiment of the present invention. In FIG. 1, the X axis and the Y axis are set in a direction in parallel with the wafer W, and the Z axis is set in a direction perpendicular to the wafer W. More specifically, the XY plane is set in parallel with the horizontal plane, and the +Z axis is set upward along the vertical direction.

As shown in FIG. 1, the exposure apparatus of the present embodiment includes an exposure light source, such as an ArF excimer laser light source, and has an illumination optical system 1 comprising, an optical integrator (homogenizer), a field step, and a condenser lens. The exposure light (exposure beam) IL, which is an ultraviolet pulse light with a 193 nm wavelength emitted from the light source, passes through the illumination optical system 1, and illuminates a reticle (mask) R. On a reticle R, a pattern to be transferred is formed, and a rectangular (slit-shaped) pattern area, of which long side is along the X direction and short side is along the Y direction out of the entire pattern area, is illuminated.

The light which passed through the reticle R form a reticle pattern on an exposure area on a wafer on which photoresist has been coated (photosensitive substrate) W at a predetermined reduction projection magnification via an immersion type projection optical system PL. In other words, a pattern image is formed on the rectangular static exposure area (effective exposure area) W which has a long side along the X direction and a short side along the Y direction on the wafer W, so as to optically correspond to the rectangular illumination area on the reticle R.

Figure 2:
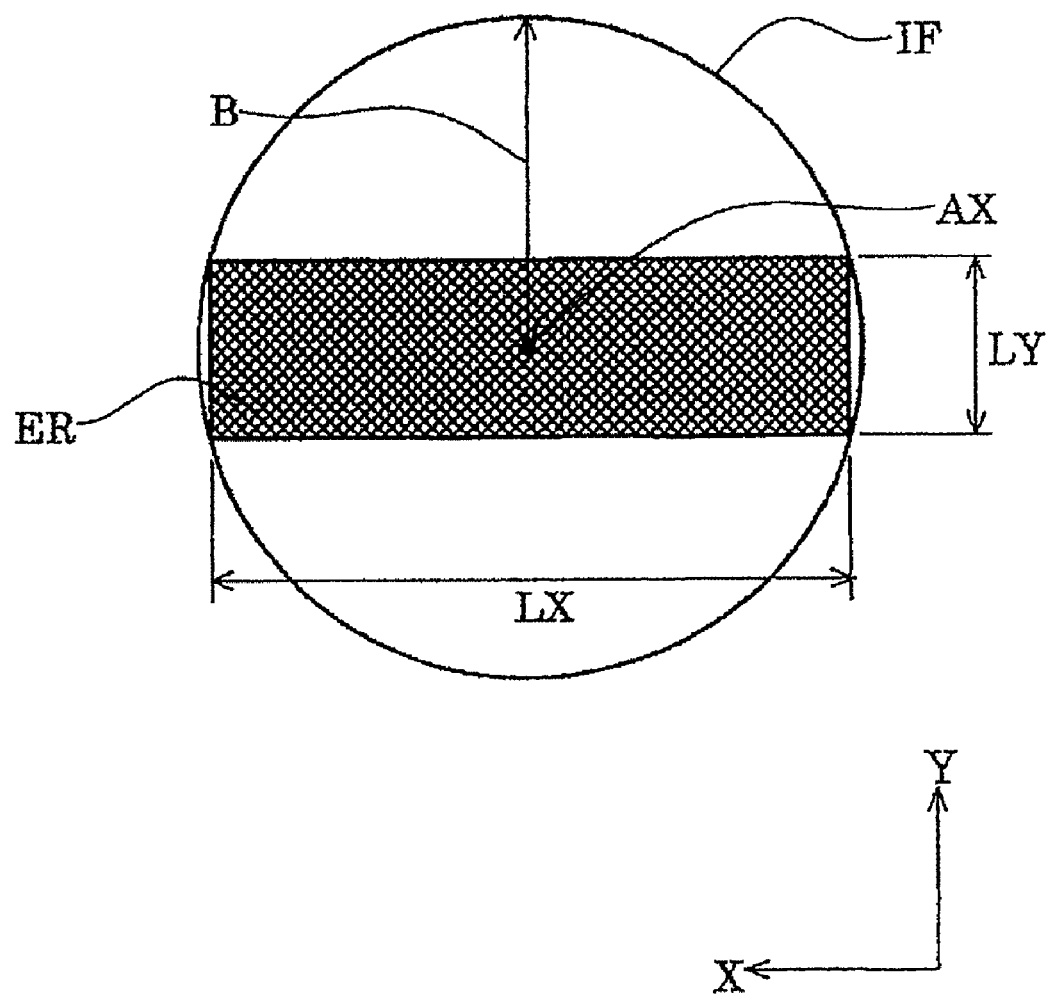
FIG. 2 is a diagram showing a positional relationship between a rectangular static exposure area formed on a wafer and an optical axis of a projection optical system according to the present embodiment.

FIG. 2 is a diagram depicting the positional relationship between a rectangular static exposure area formed on the wafer and an optical axis of the projection optical system according to the present embodiment. In the present embodiment, as shown in FIG. 2, a rectangular static exposure area ER, which extends along the X direction with the optical axis AX at the center, is set in the circular area (image circle) IF having a radius B with the optical axis AX of the projection optical system PL at the center. Here the length of the static exposure area ER in the X direction is LX, and the length in the Y direction thereof is LY.

Therefore corresponding to this, a rectangular illumination area (that is, static illumination area) having a size and shape corresponding to the static exposure area ER with the optical axis AX as the center is formed on the reticle R, although this is not illustrated. The reticle R is held in parallel with the XY plane on a reticle stage RST, and in the reticle stage RST, a mechanism for fine-moving the reticle R in the X direction, Y direction and rotation direction is integrated. The positions of the reticle stage RST in the X direction, Y direction and rotation direction are measured in real-time, and controlled by a reticle laser interferometer (not illustrated).

The wafer W is fixed in parallel with the XY plane on a Z stage 9 via a wafer holder (not illustrated). The Z stage 9 is fixed on an XY stage 10 which moves along the XY plane, which is substantially parallel with the image plane of the projection optical system PL, and controls the focus position (position in the Z direction) and inclination angle of the wafer W. For the Z stage 9, positions in the X direction, Y direction and rotation direction are measured in real-time and controlled by a wafer laser interferometer 13, which uses a movable mirror 12 installed on the Z stage 9.

The XY stage 10 is placed on a base 11, and controls the X direction, Y direction and rotation direction of the wafer W. On the other hand, a main control system 14 installed in the exposure apparatus of the present embodiment adjusts the positions of the reticle R in the X direction, Y direction and rotation direction based on the measurement values measured by the reticle laser interferometer. In other words, the main control system 14 sends a control signal to the mechanism integrated in the reticle stage RST, and adjusts the position of the reticle R by fine-moving the reticle stage RST.

Also the main control system 14 adjusts the focus position (position in the Z direction) of the wafer W and the inclination angle to match the surface on the wafer W with the image plane of the projection optical system PL by an auto focus system and auto leveling system. In other words, the main control system 14 sends a control signal to a wafer stage drive system 15, and adjusts the focus position and inclination angle of the wafer W by driving the Z stage 9 using the wafer stage drive system 15. Also the main control system 14 adjusts the positions of the wafer W in the X direction, Y direction and rotation direction based on the measurement values measured by the wafer laser interferometer 13. In other words, the main control system 14 sends the control signal to the wafer stage drive system 15, and adjusts the positions of the wafer W in the X direction, Y direction and rotation direction by driving the XY stage 10 using the wafer stage drive system 15.

During exposure, the main control system 14 sends a control signal to the mechanism integrated in the reticle stage RST, sends a control signal to the wafer stage drive system 15, and projects and exposes the pattern image of the reticle R onto a predetermined shot area on the wafer W while driving the reticle stage RST and the XY stage 10 at a velocity ratio according to the projection magnification of the projection optical system PL. Then the main control system 14 sends a control signal to the wafer stage drive system 15, and step-moves another shot area on the wafer W to the exposure position by driving the XY stage 10 using the wafer stage drive system 15.

In this way, the operation to scan and expose the pattern image of the reticle R onto the wafer W by the step and scan method is repeated. In other words, according to the present embodiment, the reticle stage RST and the XY stage 10, that is the reticle R and the wafer W, are synchronously moved (scanned) along the short side direction, that is the Y direction, of the rectangular static exposure area and static illumination area, while controlling the positions of the reticle R and wafer W using the wafer stage drive system 15 and wafer laser interferometer 13, therefore the reticle pattern is scanned and exposed on the wafer W on an area which has a width the same as the long side LX of the static exposure area and the length according to the scan quantity (moving quantity) of the wafer W.

Figure 3:
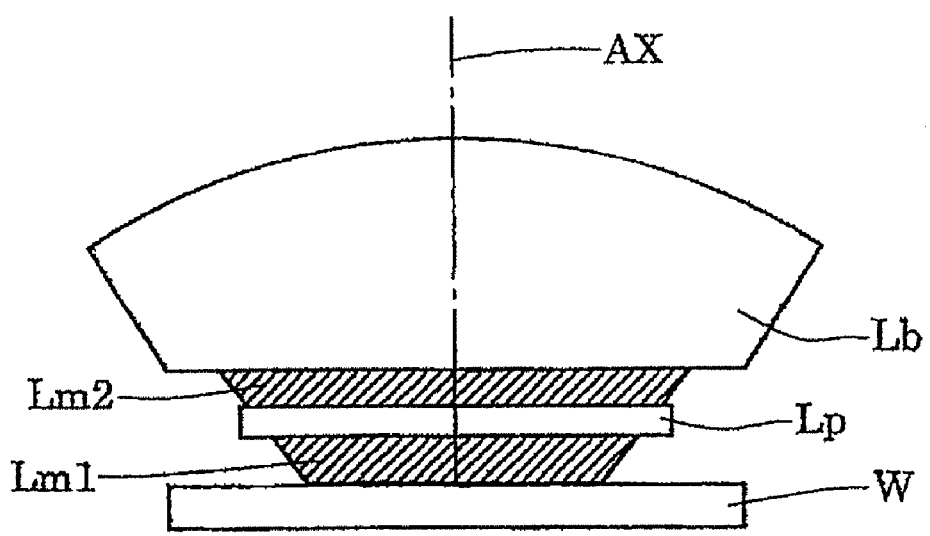
FIG. 3 is a diagram showing a configuration of a boundary lens and a wafer according to the present embodiment.

FIG. 3 is a diagram depicting the configuration between the boundary lens and the wafer according to the present embodiment. As FIG. 3 shows, in the projection optical system of the present embodiment, a submerged plane parallel plate (first light transmitting member) Lp, of which surface at the reticle R side (object side) contacts the second liquid Lm2, and surface at the wafer W side (image side) contacts the first liquid Lm1, is disposed closest to the wafer side. And as a second light transmitting member adjacent to thus submerged plane parallel plate Lp, a boundary lens Lb, of which surface facing the reticle R side contacts the gas and surface facing the wafer W side contacts the second liquid Lm2, is disposed.

In the present embodiment, pure water (deionized water) is used as a first liquid Lm1 and second liquid Lm2 having a refractive index greater than 1.1, since a large quantity of this liquid can be easily obtained at a semiconductor manufacturing factory. And the boundary lens Lb is a positive lens which has a convex surface facing the reticle R side and a flat surface facing the wafer W side. Both the boundary lens Lb and submerged plane parallel plate Lp are made from silica glass. This is because if the boundary lens Lb and submerged plane parallel plate Lp are made from fluorite, the fluorite has the nature to be dissolved (soluble) in water, so it is difficult to stably maintain the image forming performance of the projection optical system.

Also in the case of fluorite, it is known that internal refractive index distribution has high frequency components, and this dispersion of refractive index, including the high frequency components, may cause the generation of a flare light, and the image forming performance of the projection optical system tends to drop. It is also known that fluorite has a natural birefringence, and in order to maintain a good image forming performance of the projection optical system, the influence of this natural birefringence must be corrected. Therefore because of solubility, the high frequency components of the refractive index distribution and the natural birefringence of fluorite, it is preferable that the boundary lens Lb and submerged plane parallel plate Lp are made from silica glass.

To continue filling liquid (Lm1, Lm2) into an optical path between the boundary lens Lb of the projection optical system PL and the wafer W from the beginning to the end of a scan exposure in a step and scan type exposure apparatus which performs a scan exposure while relatively moving the wafer W with respect to the projection optical system PL, the technology disclosed in International Publication Number WO99/49504 and the technology disclosed in Japanese Patent Application Laid-Open No. H10-303114 can be used.

In the technology disclosed in International Publication Number WO99/49504, liquid adjusted to a predetermined temperature is supplied from a liquid supply device via a supply pipe and discharge nozzle so as to fill the optical path between the boundary lens Lb and wafer W, and liquid is recovered from the wafer W by the liquid supply device via the recovery pipe and inlet nozzle. In the technology disclosed in Japanese Patent Application Laid-Open No. H10-303114, on the other hand, a wafer holder table is formed in a container shape so as to contain liquid, and at the center of the bottom area therein the wafer W is positioned and held by vacuum suction (in liquid). The wafer holder table is also structured so that the tip of the lens-barrel of the projection optical system PL reaches into the liquid and the optical surface at the wafer side of the boundary lens Lb reaches into the liquid.

In the present embodiment, pure water, as the first liquid Lm1, is circulated in the optical path between the submerged plane parallel plate Lp and the wafer W using a first water supply/discharge mechanism 21, as shown in FIG. 1. Also pure water, as the second liquid Lm2, is circulated in the optical path between the boundary lens Lb and the submerged plane parallel plate Lp using a second water supply/discharge mechanism 22. In this way, by circulating pure water as an immersion liquid at a small flow rate, preservation and mildew proof effects are provided and change can be prevented.

In the present embodiment, the aspheric surface is given by the following Expression (a), where y is the height in a direction vertical to the optical axis, z is a distance (sag quantity) from a tangential plane at the vertex of the aspheric surface to a position on the aspheric surface in the height y along the optical axis, r is a vertex curvature radius, k is a conical coefficient, and $C_n$ is degree n of the aspheric coefficient. In the later mentioned Table (1), * is attached to the right of the surface number of the lens surface formed in an aspheric surface.

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+ \quad (a)$$

Figure 4:
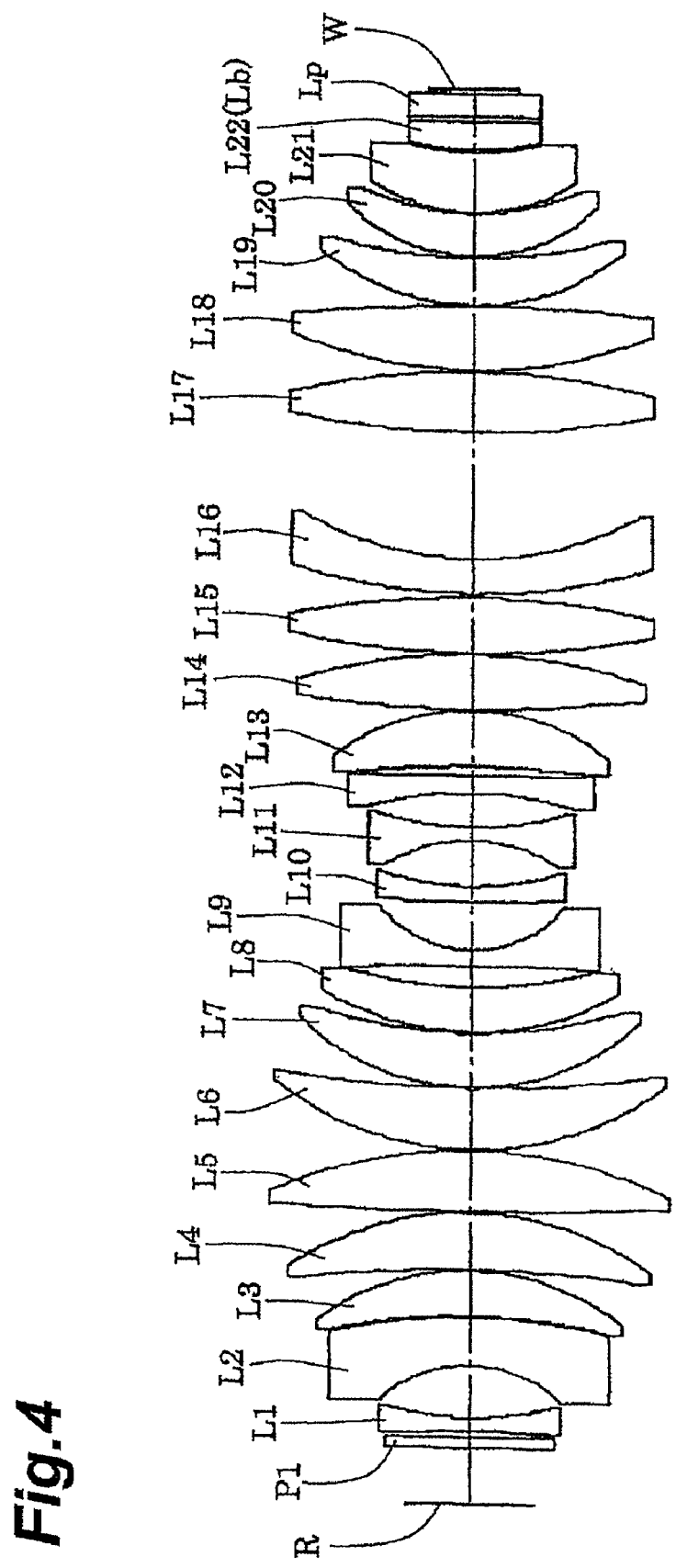
FIG. 4 is a diagram showing a configuration of lenses of the projection optical system according to the present embodiment.

FIG. 4 is a diagram depicting the configuration of lenses of the projection optical system according to the present embodiment. As FIG. 4 shows, the projection optical system PL of the present embodiment is comprised of, sequentially from the reticle side, a plane parallel plate P1, a bi-concave lens L1 which has an aspheric concave surface at the wafer side, a negative meniscus lens L2 which has a concave surface at the reticle side, a positive meniscus lens L3 which has an aspheric concave surface at the reticle side, a positive meniscus lens L4 which has a concave surface at the reticle side, a bi-convex lens L5, a positive meniscus lens L6 which has a convex surface at the reticle side, a positive meniscus lens L7 which has a convex surface at the reticle side, a positive meniscus lens L8 which has an aspheric concave surface at the wafer side, a bi-concave lens L9, a negative meniscus lens L10 which has a convex surface at the reticle side, a bi-concave lens L11 which has an aspheric concave surface at the wafer side, a plano-concave lens L12 which has an aspheric concave surface at the reticle side, a positive meniscus lens L13 which has an aspheric concave surface at the reticle side, a bi-convex lens L14, a bi-convex lens L15, a negative meniscus lens L16 which has a convex surface at the reticle side, a bi-convex lens L17, a bi-convex lens L18, a positive meniscus lens L19 which has an aspheric concave surface at the wafer side, a positive meniscus lens L20 which has an aspheric concave surface at the wafer side, a positive meniscus lens L21 which has a convex surface at the reticle side, a plano-convex lens L22 (boundary lens Lb) which has a flat surface at the wafer side, and a submerged plane parallel plate Lp.

In the present embodiment, pure water (Lm1, Lm2) having a refractive index 1.435876, with respect to ArF excimer laser light (wavelength $\lambda=193.306$ nm) which is the operation light (exposure light), is filled in an optical path between the boundary lens Lb and the submerged plane parallel plate Lp, and an optical path between the submerged plane parallel plate Lp and the wafer W. All the light transmitting members (P1, L1-L22 (Lb), Lp) are made from silica glass ($SiO_2$) having a refractive index 1.5603261 with respect to the operation light.

In the following Table (1), the values of data of the projection optical system PL according to the present embodiment are shown. In Table (1), $\lambda$ is a central wavelength of exposure light, $\beta$ is a value of projection magnification, NA is a numerical aperture at the image side (wafer side), B is a radius of the image circle IF (maximum image height Ym) on the wafer W, LX is a dimension of the static exposure area ER along the X direction (dimension of long side), and LY is a dimension of the static exposure area ER along the Y direction (dimension of short side). The surface number shows a sequence of the surface from the reticle side, r is a radius of curvature (vertex curvature radius: mm in the case of an aspheric surface), d is a space of each surface on the axis, that is surface separation (mm), and n is a refractive index with respect to the central wavelength.

TABLE (1)

(Main date)

$\lambda = 193.306$ nm
$\beta = \frac{1}{4}$
NA = 1.00
B = Ym = 13.4 mm
LX = 26 mm
LY = 5.5 mm (Optical component data)

| Surface No. | r | d | n | optical member |
|---|---|---|---|---|
| (Reticle surface) | | 50.000 | | |
| 1 | ∞ | 8.000 | 1.5603261 | (P1) |
| 2 | ∞ | 5.225 | | |
| 3 | −1943.233 | 12.000 | 1.5603261 | (L1) |
| 4* | 191.125 | 47.012 | | |
| 5 | −104.228 | 42.945 | 1.5603261 | (L2) |
| 6 | −470.767 | 1.000 | | |
| 7* | −542.622 | 39.860 | 1.5603261 | (L3) |
| 8 | −202.724 | 1.000 | | |
| 9 | −1066.606 | 49.498 | 1.5603261 | (L4) |
| 10 | −257.416 | 1.000 | | |
| 11 | 2900.000 | 53.600 | 1.5603261 | (L5) |
| 12 | −376.177 | 1.000 | | |
| 13 | 254.290 | 54.884 | 1.5603261 | (L6) |
| 14 | 927.490 | 1.000 | | |
| 15 | 192.047 | 50.000 | 1.5603261 | (L7) |
| 16 | 405.266 | 1.000 | | |
| 17 | 230.501 | 39.859 | 1.5603261 | (L8) |
| 18* | 322.792 | 19.156 | | |
| 19 | −2992.366 | 14.004 | 1.5603261 | (L9) |
| 20 | 96.198 | 42.051 | | |
| 21 | 1075.262 | 14.000 | 1.5603261 | (L10) |
| 22 | 238.222 | 39.560 | | |
| 23 | −133.879 | 12.000 | 1.5603261 | (L11) |
| 24* | 248.570 | 31.009 | | |
| 25* | −309.992 | 15.000 | 1.5603261 | (L12) |
| 26 | ∞ | 9.148 | | |
| 27* | −737.276 | 51.000 | 1.5603261 | (L13) |
| 28 | −176.320 | 1.000 | | |
| 29 | 1040.000 | 48.704 | 1.5603261 | (L14) |
| 30 | −451.186 | 1.000 | | |
| 31 | 725.000 | 48.768 | 1.5603261 | (L15) |
| 32 | −697.471 | 3.000 | | |
| 33 | 503.559 | 30.048 | 1.5603261 | (L16) |
| 34 | 281.163 | 111.150 | | |
| 35 | 724.563 | 54.923 | 1.5603261 | (L17) |
| 36 | −564.358 | 1.000 | | |
| 37 | 372.647 | 56.556 | 1.5603261 | (L18) |
| 38 | −1424.995 | 1.000 | | |
| 39 | 196.339 | 41.207 | 1.5603261 | (L19) |
| 40* | 498.912 | 1.000 | | |
| 41 | 147.694 | 36.513 | 1.5603261 | (L20) |
| 42* | 185.195 | 1.000 | | |
| 43 | 147.798 | 52.775 | 1.5603261 | (L21) |
| 44 | 216.307 | 2.256 | | |
| 45 | 238.988 | 26.298 | 1.5603261 | (L22:Lb) |
| 46 | ∞ | 3.000 | 1.435876 | (Lm2) |
| 47 | ∞ | 20.000 | 1.5603261 | (Lp) |
| 48 | ∞ | 3.000 | 1.435876 | (Lm1) |
| (Wafer surface) | | | | |

(Aspheric data)

Figure 5:
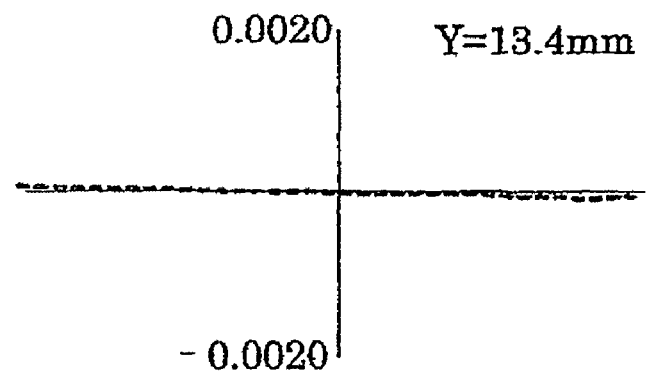
FIG. 5 are diagrams showing the lateral aberration in the projection optical system of the present embodiment.
Figure 5:
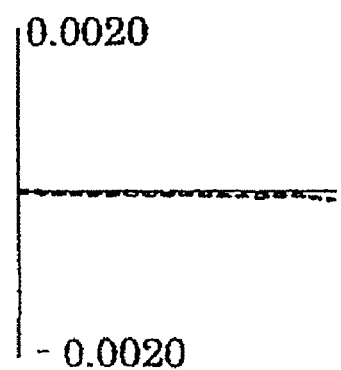
Figure 5:
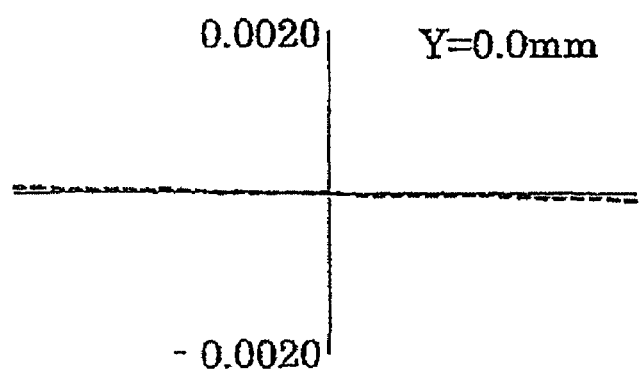

Fourth surface $\kappa = 0$
$C_4 = -1.48452 \times 10^{-7}$   $C_6 = 5.65923 \times 10^{-12}$
$C_8 = -2.78621 \times 10^{-16}$   $C_{10} = 2.37952 \times 10^{-20}$
$C_{12} = -1.19751 \times 10^{-24}$   $C_{14} = 1.82016 \times 10^{-28}$
$C_{16} = -5.16714 \times 10^{-33}$ Seventh surface $\kappa = 0$
$C_4 = -1.27342 \times 10^{-8}$   $C_6 = 2.18802 \times 10^{-13}$
$C_8 = -4.26931 \times 10^{-18}$   $C_{10} = 4.55926 \times 10^{-22}$
$C_{12} = -2.06887 \times 10^{-26}$   $C_{14} = 1.46041 \times 10^{-30}$
$C_{16} = -1.78415 \times 10^{-35}$ Eighteenth surface $\kappa = 0$
$C_4 = -1.79752 \times 10^{-8}$   $C_6 = 1.95237 \times 10^{-14}$
$C_8 = -3.82843 \times 10^{-18}$   $C_{10} = -3.85072 \times 10^{-22}$
$C_{12} = 1.96652 \times 10^{-26}$   $C_{14} = -3.59987 \times 10^{-31}$
$C_{16} = 7.72530 \times 10^{-37}$ Twenty-fourth surface $\kappa = 0$
$C_4 = 1.86641 \times 10^{-8}$   $C_6 = -2.48589 \times 10^{-12}$
$C_8 = -3.40085 \times 10^{-17}$   $C_{10} = 1.20901 \times 10^{-20}$ TABLE (1)-continued $C_{12} = -4.99726 \times 10^{-25}$      $C_{14} = -4.18254 \times 10^{-29}$
$C_{16} = 2.90453 \times 10^{-33}$ Twenty-fifth surface $\kappa = 0$
$C_4 = -4.42908 \times 10^{-8}$        $C_6 = 3.24465 \times 10^{-12}$
$C_8 = -2.17933 \times 10^{-18}$       $C_{10} = 3.09914 \times 10^{-21}$
$C_{12} = -5.89781 \times 10^{-25}$    $C_{14} = 1.44812 \times 10^{-28}$
$C_{16} = -9.31891 \times 10^{-33}$ Twenty-seventh surface $\kappa = 0$
$C_4 = 1.28473 \times 10^{-8}$         $C_6 = -1.52185 \times 10^{-12}$
$C_8 = 3.27024 \times 10^{-17}$        $C_{10} = 2.96321 \times 10^{-21}$
$C_{12} = -3.12141 \times 10^{-25}$    $C_{14} = 1.24069 \times 10^{-29}$
$C_{16} = -3.63752 \times 10^{-35}$ Fortieth surface $\kappa = 0$
$C_4 = 1.37642 \times 10^{-8}$         $C_6 = 7.52294 \times 10^{-14}$
$C_8 = 8.14751 \times 10^{-18}$        $C_{10} = -2.38664 \times 10^{-22}$
$C_{12} = 1.89052 \times 10^{-26}$     $C_{14} = -5.72857 \times 10^{-31}$
$C_{16} = 1.24235 \times 10^{-35}$ Forty second surface $\kappa = 0$
$C_4 = -4.67034 \times 10^{-8}$        $C_6 = -9.90580 \times 10^{-13}$
$C_8 = -5.14638 \times 10^{-18}$       $C_{10} = 1.69872 \times 10^{-21}$
$C_{12} = -1.07534 \times 10^{-25}$    $C_{14} = 5.68180 \times 10^{-30}$
$C_{16} = -1.53908 \times 10^{-34}$ FIG. 5 are diagrams depicting the lateral aberration in the projection optical system of the present embodiment. In the aberration diagrams, Y indicates the image height. As the aberration diagrams in FIG. 5 show, in the present embodiment, aberration with respect to the excimer laser light of which wavelength is 193.306 nm is well corrected even if a large numerical aperture (NA=1.00) at the image side and a relatively large static exposure area ER (26 nm×5.5 mm) are secured. Therefore according to the present embodiment, a high numerical aperture at the image side, that is 1.00, with respect to the ArF excimer laser light of which wavelength is 193.306 nm, can be secured and a 26 mm×5.5 mm rectangular effective exposure area (static exposure area) ER can be secured, so a circuit pattern can be scanned and exposed in a 26 mm×33 mm rectangular exposure area at high resolution.

In this way, according to the projection optical system PL of the present embodiment, a relatively large effective image forming area can be secured while securing a large effective numerical aperture at the image side, by including pure water (Lm1, Lm2) having a large refractive index in an optical path between the boundary lens Lb and the wafer W. Also the submerged plane parallel plate Lp is disposed in the optical path between the boundary lens Lb and the wafer W, so even if pure water as immersion liquid is contaminated by the photoresist coated on the wafer W, for example, contamination on the optical surface of the boundary lens Lb at the image side by the contaminated pure water can be prevented by the function of the submerged plane parallel plate Lp included between the boundary lens Lb and the wafer W.

Figure 6:
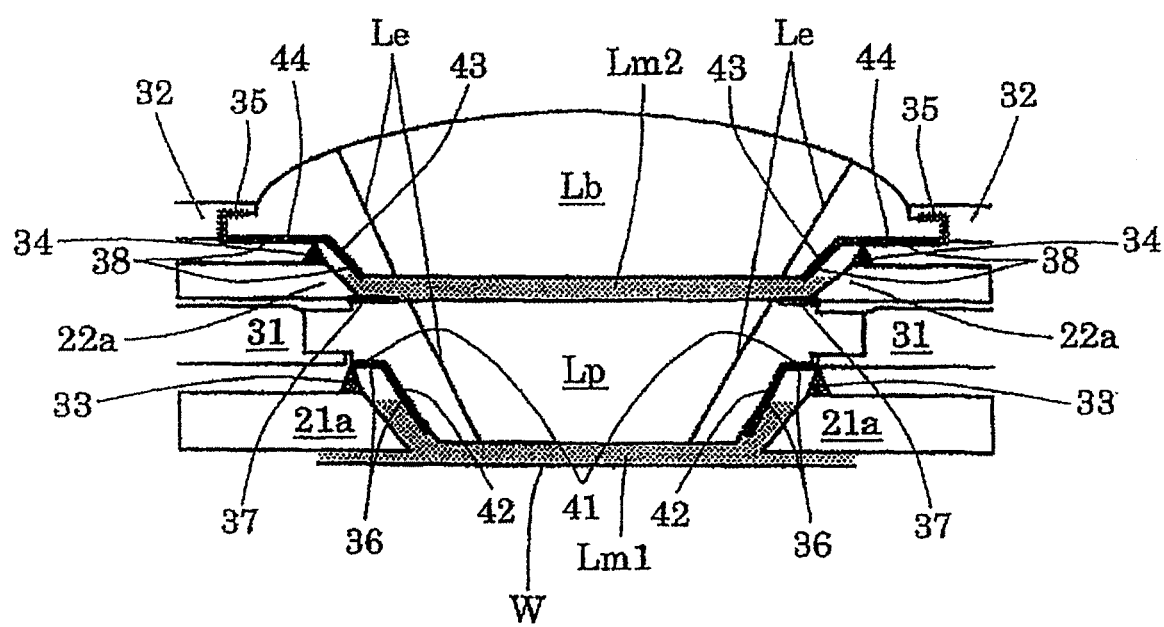
FIG. 6 is a diagram showing a general configuration of the characteristic key sections of the projection optical system of the present embodiment.

FIG. 6 is a diagram showing a general configuration of the characteristic key sections of the projection optical system according to the present embodiment. As FIG. 6 shows, the submerged plane parallel plate Lp is supported by a first support member 31 using a conventional mechanism hold method. The boundary lens Lb, on the other hand, is adhesive-supported by a second support member 32 using an appropriate adhesive (bond). This is because in an immersion type projection optical system having a high numerical aperture, an optical surface at the mask side must be a convex shape with a small radius of curvature, in order to prevent a total reflection of lights which enter the boundary lens Lb, and the thickness of the outer edges of the boundary lens Lb becomes very thin.

To an optical path between the submerged plane parallel plate Lp and the wafer W, an end of a water supply/discharge nozzle 21a of the first water supply/discharge mechanism 21 is directed, and pure water, as the first liquid Lm1, circulates through the optical path between the submerged plane parallel plate Lp and the wafer W by the function of this water supply/discharge nozzle 21a. In the same way, to an optical path between the boundary lens Lb and the submerged plane parallel plate Lp, an end of a water supply/discharge nozzle 22a of the second water supply/discharge mechanism 22 is directed, and pure water, as the second liquid Lm2, circulates through the optical path between the boundary lens Lb and the submerged plane parallel plate Lp by the function of this water supply/discharge nozzle 22a.

Also at the end of the water supply/discharge nozzle 21a, a seal member 33, for preventing the outflow of the pure water Lm1 from the optical path between the submerged plane parallel plate Lp and the wafer W to the outside (inside the projection optical system PL and wafer stage WS side) is installed. The seal member 33 is formed by water repellent fluororesin (preferably an elastic body). The seal member 33 has a triangular cross-section, for example, and the tip thereof contacts the non-tapered portion 41 of the side surface of the submerged plane parallel plate Lp.

The side surface of the submerged plane parallel plate Lp is an external side surface excluding the surface at the wafer side and surface at the mask side of the submerged plane parallel plate Lp in [the area] outside the effective area (area where effective image forming beam passes through, that is an area inside the image forming beam Le at the outermost edge) of the submerged plane parallel plate Lp. The non-tapered portion 41 is a portion on the side surface of the submerged plane parallel plate Lp excluding the tapered portion 42, that is a portion which includes a plane substantially parallel with the wafer W. The side surface of the boundary lens Lb, tapered portion 43 of the side surface of the boundary lens Lb, and non-tapered portion 44 of the side surface of the boundary lens Lb can also be defined in the same way.

Also at the end of the water supply/discharge nozzle 22a, on the other hand, a seal member 34, for preventing the outflow of the pure water Lm2 from the optical path between the boundary lens Lb and the submerged plane parallel plate Lp to the outside (inside the projection optical system PL and wafer stage WS side), is installed. The seal member 34 is also formed by water repellent fluororesin (preferably an elastic body), and just like the seal member 33, has a triangular cross-section, and the tip thereof contacts the non-tapered portion 44 of the side surface of the boundary lens Lb.

As mentioned above, the seal members 33 and 34, as liquid prevention means, are made from a material which tends to deteriorate by the irradiation of exposure light. Therefore the seal members (33, 34) easily deteriorate by the irradiation of flare light, and as a result easily causes the deterioration of the image forming performance of the projection optical system PL due to the outflow of immersion liquid. The boundary lens Lb is adhesive-supported by the second support member 32, but the adhesive function tends to deteriorate when the adhesive support area 35 of the boundary lens Lb receives irradiation of the flare light, and as a result, the image forming performance of the projection optical system PL deteriorates due to the positional deviation of the boundary lens Lb.

Therefore in the present embodiment, a light shielding film 36, for shielding the passing of exposure light, is formed from a tapered portion 42 to the non-tapered portion 41 of the side surface of the submerged plane parallel plate Lp. Also on the surface at the mask side outside the effective area of the submerged plane parallel plate Lp, a light shielding film 37, for shielding the passing of the exposure light, is formed. Also a light shielding film 38, for shielding the passing of the exposure light, is formed from the tapered portion 43 to the non-tapered portion 44 of the side surface of the boundary lens Lb. Here the light shielding films 36-38 are disposed so as to shield the flare lights which reach the seal members 33 and 34 and the adhesive support are 35.

As described above, the flare lights reaching the seal members (33, 34) and the adhesive support area 35 are shielded by the function of the light shield films (36-38), so the deterioration of the seal members (33, 34) as liquid prevention means and the deterioration of the adhesive function of the adhesive support area 35 substantially do not occur, and therefore the deterioration of the image forming performance of the projection optical system PL, due to the outflow of the immersion liquid and the positional deviation of the boundary lens Lb, substantially does not occur. In other words, in the case of the immersion type projection optical system PL according to the present embodiment, the outflow of the immersion liquid (Lm1, Lm2) to inside the optical system and to the wafer stage WS side and position deviation of the boundary lens Lb are stably prevented, and good image forming performance can be maintained. Therefore in the exposure apparatus of the present embodiment, a micro-pattern of the mask M can be projected and exposed to the wafer W accurately and stably using a high resolution immersion type projection optical system PL, which can stably prevent the outflow of immersion liquid (Lm1, Lm2) to inside the optical system and to the wafer stage WS side and positional deviation of the boundary lens Lb, and can maintain good imaging performance.

Generally an absorption film or reflection film can be selected as the light shielding film. However, when the immersion liquid is water, the manufacturing of a reflection film, which has good water resistance and a high reflectance characteristic, is very difficult. An aluminum film, for example, has a high reflectance characteristic, but oxidizes by water, so using it is impractical. Therefore in the present embodiment, it is practical to use an absorption film as the light shielding film. In this case, in terms of resistance against the deterioration of the seal member or adhesive support area by the irradiation of flare light, it is desirable to cover the entire area around the seal member or adhesive support area with the light shielding film.

On the other hand, when a light shielding film is formed over a wide range, the heat absorption quantity of the flare light in the light shielding film increases, which increases the temperature of the optical elements (lenses, plane parallel plates) and immersion liquid, and deteriorates the image forming performance of the projection optical system. Therefore an appropriate range of forming the light shielding film must be decided considering the deterioration resistance of the seal member or adhesive support area and the influence of a temperature rise of the optical elements and immersion liquid.

In the present embodiment, the following Condition (1) is satisfied in order to form the light shielding film (particularly the light shielding film 36 closest to the wafer W) in an appropriate range. In Condition (1), D is a space between the wafer W and the light shielding film 36, $\Theta$ is a maximum incident angle of the image forming beam which reaches the wafer W, and Ym is a maximum image height on the wafer W.

$$0.25 < D/Ym \times \tan\Theta < 1.7 \quad (1)$$

If Ym×tan $\Theta$ is less than the lower limit of the Condition (1), then the space D becomes small, and the light quantity of the flare light, which reaches the light shielding film 36, becomes too high, because of the reflection on the wafer W surface. As a result, the heat absorption quantity of the light shielding film 36 increases, and the image forming performance of the projection optical system PL deteriorates by the temperature increase of the submerged plane parallel plate Lp and immersion liquid (Lm1). If Ym×tan $\Theta$ exceeds the upper limit of the Condition (1), on the other hand, the space D becomes large, and the range of forming of the light shielding film 36 becomes too narrow. As a result, deterioration of the seal members (33, 34) and deterioration of the adhesion function cannot be suppressed sufficiently, and the image forming performance of the projection optical system PL deteriorates.

In order to exhibit the above mentioned effects even better, it is preferable to set the lower limit of the Condition (1) to 0.35 and the upper limit to 1.4. Actually in this embodiment, the space D is set to 7 mm based on the later mentioned reason. The maximum incident angle $\Theta$ is about 44.1 degrees, and the maximum image height Ym is 13.4 mm. Therefore the corresponding values of the Condition (1) are D/Y×tan $\Theta$=7/13.4×0.97=0.507, which satisfies the Condition (1).

Figure 7:
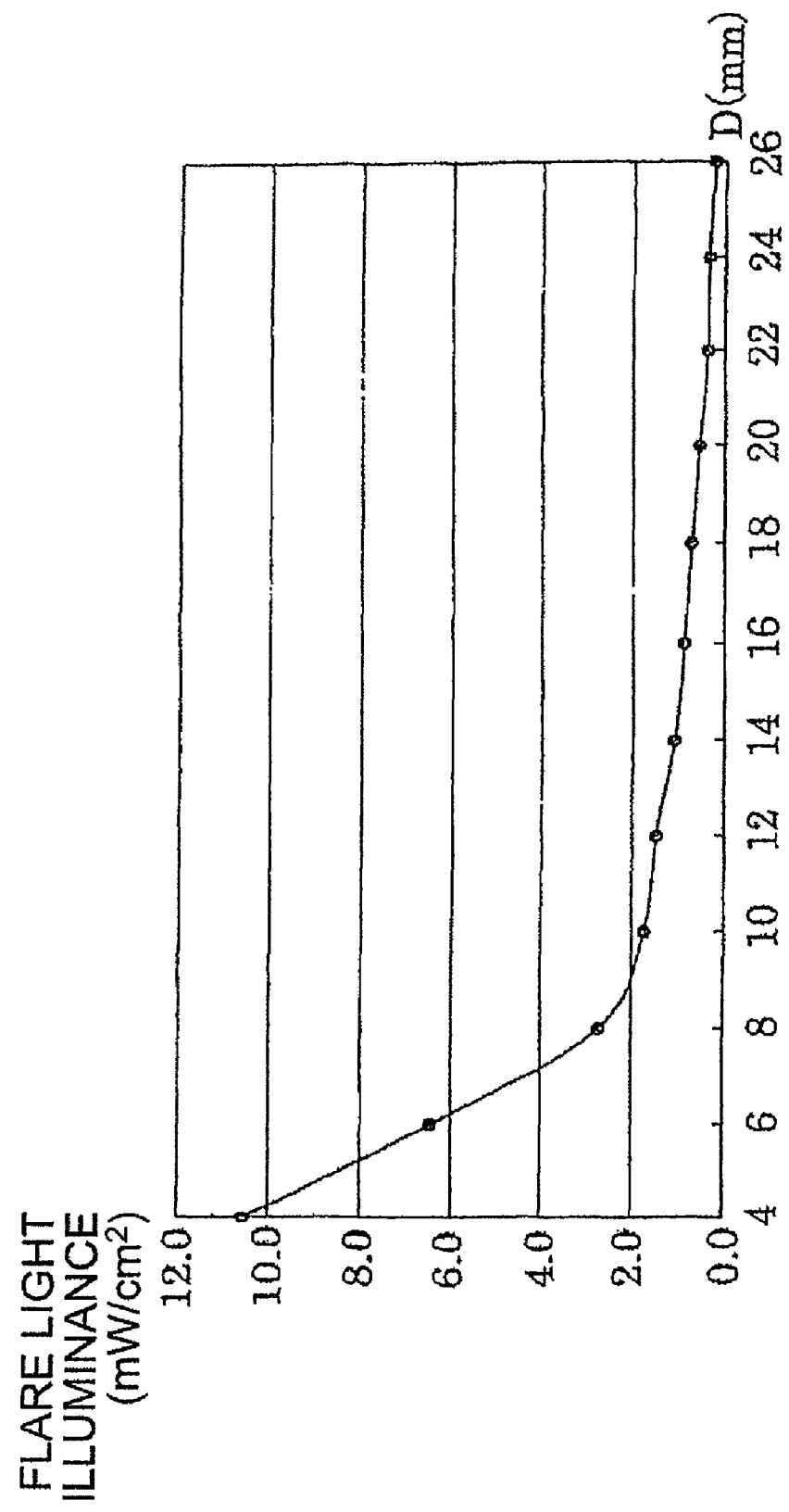
FIG. 7 is a graph showing a relationship of a space D (mm) between a wafer W and a light shielding film 36, and an illuminance distribution (mW/cm$^2$) of a flare light which reaches the side surface of a submerged plane parallel plate Lp in the liquid when the illuminance on the wafer W is 4 W/cm$^2$ in the present embodiment.

FIG. 7 is a graph depicting the relationship of the space D (mm) between the wafer W and the light shielding film 36 and the illuminance distribution (mW/cm²) of the flare light which reaches the side surface of the submerged plane parallel plate Lp when the illuminance on the wafer W is 4 W/cm². The wafer illuminance 4 W/cm² is the illuminance assumed as the maximum in the specification of the exposure apparatus according to the present embodiment. As FIG. 7 shows, the threshold to maintain a good imaging performance of the projection optical system PL is about D=6 mm-7 mm. Therefore in the present embodiment, the space D between the wafer W and the light shielding film 36, which is formed from the tapered portion 42 to the non-tapered portion 41 on the side surface of the submerged plane parallel plate Lp, is set to D=7 mm, referring to the illuminance distribution of the flare light which reaches the side surface of the submerged plane parallel plate Lp.

Also in the present embodiment, the following Condition (2) is satisfied. In the Condition (2), S is a transmitted wavefront change quantity of the submerged plane parallel plate Lp or boundary lens Lb in the case where the submerged plane parallel plate Lp or boundary lens Lb and the seal member 33 or 34 contact. In the unit m$\lambda$ RMS of the transmitted wavefront change quantity S, m$\lambda$ is 1/1000 of the wavelength $\lambda$ of the light, and RMS is the root mean square.

$$S < 7\ m\lambda RMS \quad (2)$$

The Condition (2) specifies the installation tolerance of the seal member 33 or 34 for preventing a leak of the immersion liquid into inside the projection optical system PL and to the wafer stage WS side. Here when the seal member 33 or 34 contacts the submerged plane parallel plate Lp or the boundary lens Lb as the light transmitting member, surface deformation is generated on the optical surface of the light transmitting member (Lp, Lb) due to stress by the seal member (33, 34), and a transmitted wavefront aberration is generated in the light transmitting member (Lp, Lb). The transmitted wavefront aberration due to stress by the seal member (33, 34) can be corrected by adjusting the position and orientation of the optical elements (e.g. lens) constituting the projection optical system PL, or using an aspheric surface adding method for the optical surface (e.g. lens surface).

However, if the transmitted wavefront aberration generated in the light transmitting member (Lp, Lb) due to the stress by the seal member (33, 34) is major, then correction becomes difficult. By specifying the installation tolerance for the seal member (33, 34) so as to satisfy the Condition (2), the transmitted wavefront aberration due to stress by the seal member (33, 34) can be decreased to a range where the above mentioned correction method can be used.

Also in the case where the seal member (33, 34) is exchanged, the transmitted wavefront aberration of the projection optical system PL can be appropriately suppressed throughout before and after exchange of the seal member (33, 34) by satisfying the range of the Condition (2). To exhibit the above effect even better, it is preferable to satisfy S<5 m$\lambda$ RMS. In a case of providing a plurality of seal members for a light transmitting support member, when the transmitted wavefront change quantity when one of the plurality of seal members contacts the light transmitting support member is s, the standard deviation of the transmitted wavefront change quantity s for the plurality of seal members is regarded as the transmitted wavefront change quantity S.

Figure 8:
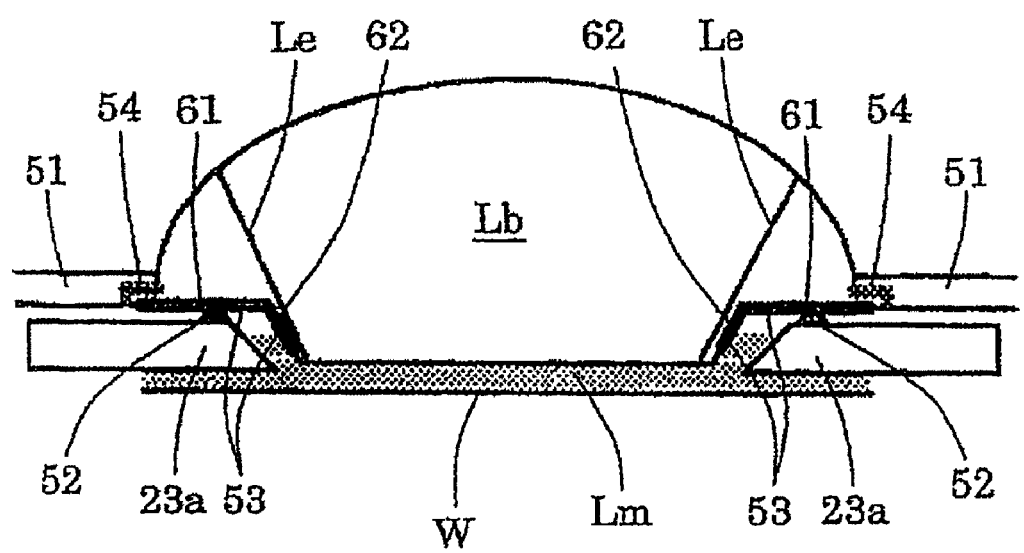
FIG. 8 is a diagram showing a general configuration of the key sections of a first modification where the installation of the submerged plane parallel plate in an optical path between the boundary lens and wafer is omitted.

In the above embodiment, the submerged plane parallel plate Lp is disposed in the optical path between the boundary lens Lb and the wafer W, but the present invention is not limited to this, and a configuration where installation of the submerged plane parallel plate Lp is omitted is also possible, as shown in the first modification in FIG. 8. In the first modification in FIG. 8, the boundary lens Lb is adhesive-supported by the support member 51 using an appropriate adhesive. To the optical path between the boundary lens Lb and the wafer W, the end of a water supply/discharge nozzle 23a of a water supply/discharge mechanism, which is not illustrated, is directed, and pure water (immersion water) Lm circulates through the optical path between the boundary lens Lb and the wafer W by the function of this water supply/discharge nozzle 23a.

At the end of the water supply/discharge nozzle 23a, a seal member 52, for preventing the outflow of the pure water Lm from the optical path between the boundary lens Lb and the water W to the outside (inside the projection optical system PL and wafer stage WS side), is installed. The seal member 52 is formed with water repellent fluororesin (preferably an elastic body), for example, which has a triangular cross-section, and the tip thereof contacts the non-tapered portion 61 of the side surface of the boundary lens Lb. The light shielding film 53 for shielding the passing of the exposure light is formed from the tapered portion 62 to the non-tapered portion 61 on the side surface of the boundary lens Lb. Here the light shielding film 53 is disposed so as to shield the flare light which reaches the seal member 52 and adhesive support area 54.

In this way, in the first modification in FIG. 8 as well, the flare light which reaches the seal member 52 and the adhesive support area 54 can be shielded by the function of the light shielding film 53, so the deterioration of the seal member 52 and the deterioration of the adhesive function of the adhesive support area 54 substantially do not occur, and therefore deterioration of the imaging performance of the projection optical system PL, due to the outflow of the immersion liquid and positional deviation of the boundary lens Lb, substantially does not occur. In the case of the first modification in FIG. 8 as well, it is preferable to satisfy the Condition (1) for forming the light shielding film 53 in an appropriate range, and to satisfy the Condition (2) to suppress the transmitted wavefront aberration generated in the boundary lens Lb due to stress by the seal member 52 to be low.

In the above embodiment, the mechanical hold method is used to support the submerged plane parallel plate Lp by the first support member 31, but the present invention is not limited to this, but the submerged plane parallel plate Lp may be adhesive-supported using appropriate adhesive. In this case, it is preferable to additionally form a light shielding film if necessary so that the flare light which reaches the adhesive support area of the submerged plane parallel plate Lp is shielded.

In the above embodiment and modification, the light shielding film (38, 53) is formed from the tapered portion (43, 62) to the non-tapered portion (44, 61) of the side surface of the boundary lens Lb. The light shielding film 36 is formed from the taper portion 42 to the non-tapered portion 41 of the side surface of the submerged plane parallel plate Lp, and the light shielding film 37 is formed on the surface at the mask side outside the effective area of the submerged plane parallel plate Lp. However, the present invention is not limited to this, but various modifications are possible for the position and range of forming the light shielding film. Generally in the boundary lens Lb and the submerged plane parallel plate Lp, the light shielding film is formed in an appropriate position and in an appropriate range of at least one surface out of the surface at the mask side, the surface at the wafer side and the side surface outside the effective area.

Also in the above embodiment and modification, the seal members (33, 34, 52) are installed as liquid prevention means for preventing the entry of pure water Lm1 into inside of the projection optical system PL, but instead of these seal members (33, 34, 52), or in addition to these seal members (33, 34, 52), a water repellent functional film may be formed on the boundary lens Lb and submerged plane parallel plate Lp.

Now a second modification, where a water repellent functional film is formed as liquid prevention means for preventing the entry of the pure water Lm1 into inside of the projection optical system PL and a light shielding film is formed as deterioration reduction means for reducing the deterioration of the liquid prevention means, will be described with reference to FIG. 9.

Figure 9:
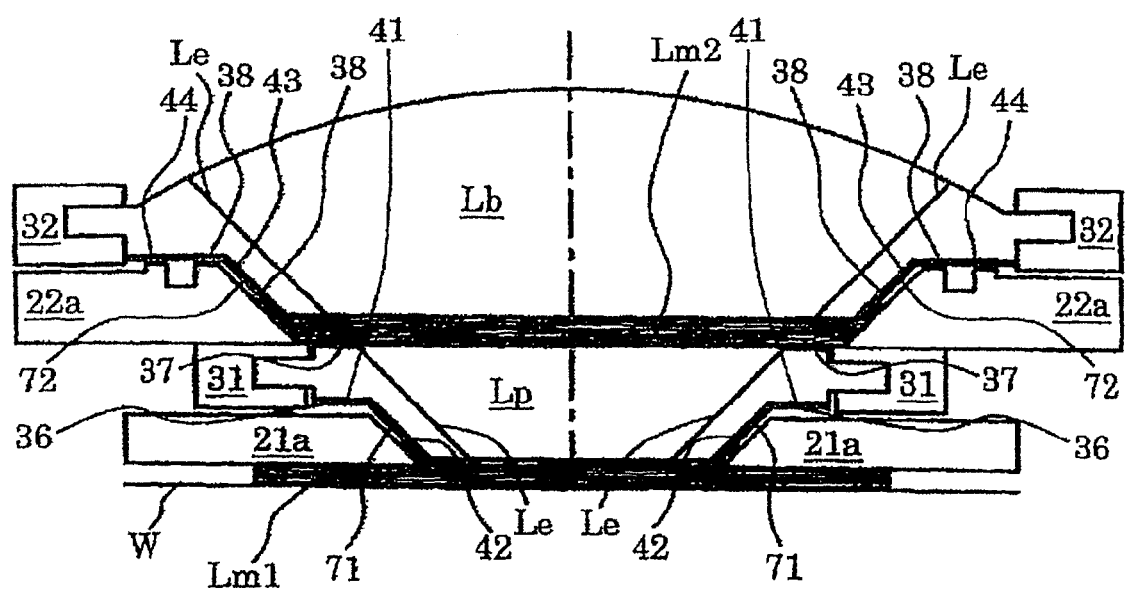
FIG. 9 is a diagram showing a general configuration of the characteristic key sections of the projection optical system according to the second modification.

FIG. 9 is a diagram showing a general configuration of a characteristic key sections of a projection optical system according to the second modification. In FIG. 9, composing elements having a similar function as the elements in FIG. 6 are denoted with the same reference symbols. In FIG. 9, differences in the configuration from the above mentioned embodiment in FIG. 6 are that the space between the water supply/discharge nozzle 21a and the side surface (tapered surface) of the submerged plane parallel plate Lp is a micro-space, and the water repellent functional film 71 is formed on the side surface (tapered portion 42) of the submerged plane parallel plate Lp, so as to prevent the outflow of the immersion liquid Lm1 from the optical path between the submerged plane parallel plate Lp and the wafer W to the outside (inside the projection optical system PL), and that the space between the water supply/discharge nozzle 22a and the boundary lens Lb is a micro-space, and the water repellent functional film 72 is formed on the side surface (tapered portion 43) of the boundary lens Lb, so as to prevent the outflow of the immersion liquid Lm2 from the optical path between the boundary lens Lb and the submerged plane parallel plate Lp to the outside (inside the projection optical system PL).

By this water repellent functional film 71, the immersion liquid Lm1, reaching the first support member 31 via the part between the inclined surface of the water supply/discharge nozzle 21a and the side surface of the submerged plane parallel plate Lp, can be prevented. And by this water repellent functional film 72, the immersion liquid Lm2, reaching the second support member 32 via the inclined surface of the water supply/discharge nozzle 22a and the side surface of the submerged plane parallel plate Lp, can be prevented. Here the water repellent functional films 71 and 72 are formed not only on the tapered portions 42 and 43, but also on the non-tapered portion adjacent to the tapered portion 42 and the non-tapered portion adjacent to the tapered portion 43.

The water repellent function films 71 and 72 tend to deteriorate and lose its water repellent function by the irradiation of the exposure light, so in the second modification the light shielding film 36, for shielding the passing of the exposure light, is formed from the tapered portion 42 to the non-tapered portion 41 of the side surface of the submerged plane parallel plate Lp, and the light shielding film 37, for shielding the passing of exposure light, is formed on the surface of the mask side outside the effective area of the submerged plane parallel plate Lp, so as to shield exposure light which reaches the water repellent functional films 71 and 72 as the liquid prevention means, and to prevent deterioration of the water repellent functional films 71 and 72. Also the light shielding film 38 for shielding the passing of exposure light is formed from the tapered portion 43 to the non-tapered portion 44 of the side surface of the boundary lens Lb.

As described above, the flare lights which reach the water repellent functional films (71 and 72) are shielded by the function of the light shielding films (36-38), the deterioration of the water repellent functional films (71, 72) as the liquid prevention means substantially does not occur, and therefore deterioration of the image forming performance of the projection optical system PL, due to the outflow of the immersion liquid, substantially does not occur. In other words, in the immersion type projection optical system PL according to the second modification, the outflow of the immersion liquid (Lm1, Lm2) to inside of the optical system and the wafer stage WS side is stably prevented, and good image forming performance can be maintained. Therefore in the exposure apparatus of the second modification, the micro-pattern of the mask M can be projected and exposed on the wafer W accurately and stably using the high resolution immersion type projection optical system PL, which can stably prevent the outflow of immersion liquid (Lm1, Lm2) to inside of the optical system and to the wafer stage WS side and positional deviation of the boundary lens Lb, and maintain good imaging performance. The light shielding film according to the second modification is formed so as to satisfy the above mentioned Condition (1), so that deterioration of the imaging performance of the projection optical system PL is prevented.

Figure 10:
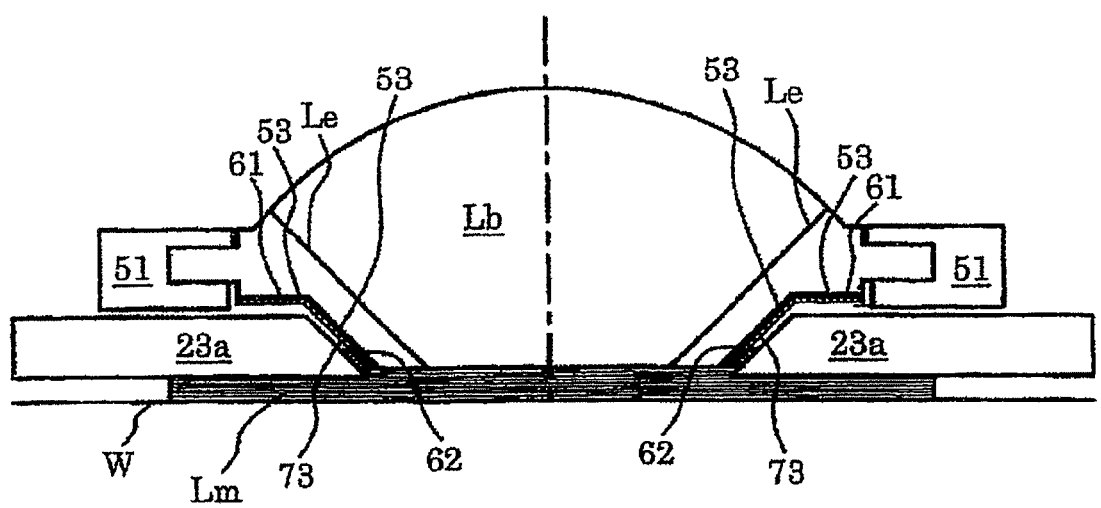
FIG. 10 is a diagram showing a general configuration of the characteristic key sections of the projection optical system according to the third modification.

In the second modification, the submerged plane parallel plate Lp is disposed in the optical path between the boundary lens Lb and the wafer W, but the present invention is not limited to this, but the configuration where the installation of the submerged plane parallel plate Lp is omitted is also possible, as shown in the third modification in FIG. 10. In FIG. 10, composing elements having similar functions as the elements in FIG. 8 are denoted with the same reference symbols. In FIG. 10, differences in the configuration from the above mentioned embodiment in FIG. 8 are that the space between the water supply/discharge nozzle 23a and the boundary lens Lb is a micro-space, and the water repellent functional film 73 is formed on the side surface (tempered portion 62 and non-tapered portion 61) of the boundary lens Lb, so as to prevent the outflow of the immersion liquid Lm from the optical path between the boundary lens Lb and the wafer W to the outside (inside the projection optical system PL). And in the third modification as well, a light shielding film 53, for shielding the passing of exposure light, is formed from the tapered portion 62 to the non-tapered portion 61 of the side surface of the boundary lens Lb. Here the light shielding film 53 is disposed so as to shield the flare lights which reach the water repellent functional film 73.

In the third modification in FIG. 10 as well, the flare lights which reach the water repellent functional film 73 are shielded by the function of the light shielding film 53, so deterioration of the water repellent functional film 73 substantially does not occur, and therefore deterioration of the imaging performance of the projection optical system PL, due to the outflow of the immersion liquid substantially does not occur. Also in the third modification in FIG. 10 as well, it is preferable to satisfy the Condition (1) to form the light shielding film 53 in an appropriate range.

In the exposure apparatus of the above embodiment, a micro-device (e.g. semiconductor device, image sensing device, liquid crystal display device, thin film magnetic head) can be manufactured by irradiating a reticle (mask) by an illumination device (illumination step) and exposing a pattern for transfer which is formed on the mask into a photosensitive substrate using the projection optical system (exposure step). Now an example of a method of acquiring a semiconductor device as a micro-device by forming a predetermined circuit pattern on a wafer, as the photosensitive substrate using the exposure apparatus of the present embodiment, will be described with reference to the flow chart in FIG. 11.

Figure 11:
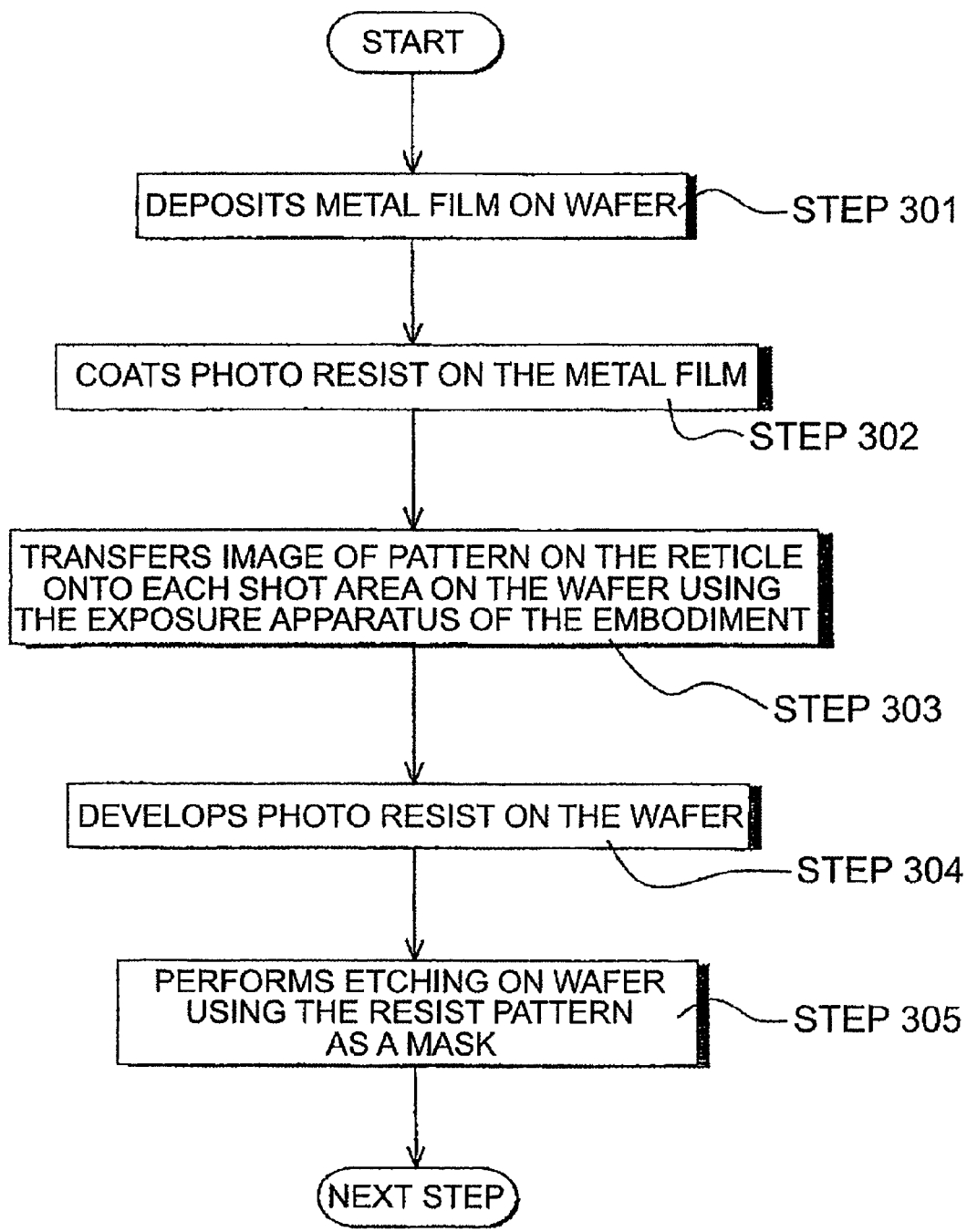
FIG. 11 is a flow chart showing a method when a semiconductor device is acquired as a micro-device.

First in step 301 in FIG. 11, a metal film is deposited on one lot of wafers. Then in step 302, a photoresist is coated on a metal film on the one lot of wafers. Then in step 303, an image of a pattern on a mask is sequentially exposed and transferred to each shot area on the one lot of wafers via the projection optical system of the exposure apparatus of the present embodiment. Then in step 304, photoresist on the one lot of wafers is developed, and then in step 305, a circuit pattern corresponding to the pattern on the mask is formed in each shot area of each wafer by performing etching on the one lot of wafers using the resist pattern as a mask.

Then devices such as semiconductor devices are manufactured by forming circuit patterns on higher layers. According to this semiconductor device manufacturing method, semiconductor devices having extremely fine circuit patterns can be acquired with good throughput. In step 301-step 305, metal is deposited on the wafer, resist is coated on this metal film, and each step of exposure, development and etching is performed, but needless to say, silicon oxide film may be formed on the wafer before these steps, then resist is coated on the silicon oxide film, and each step of exposure, development and etching is performed.

Figure 12:
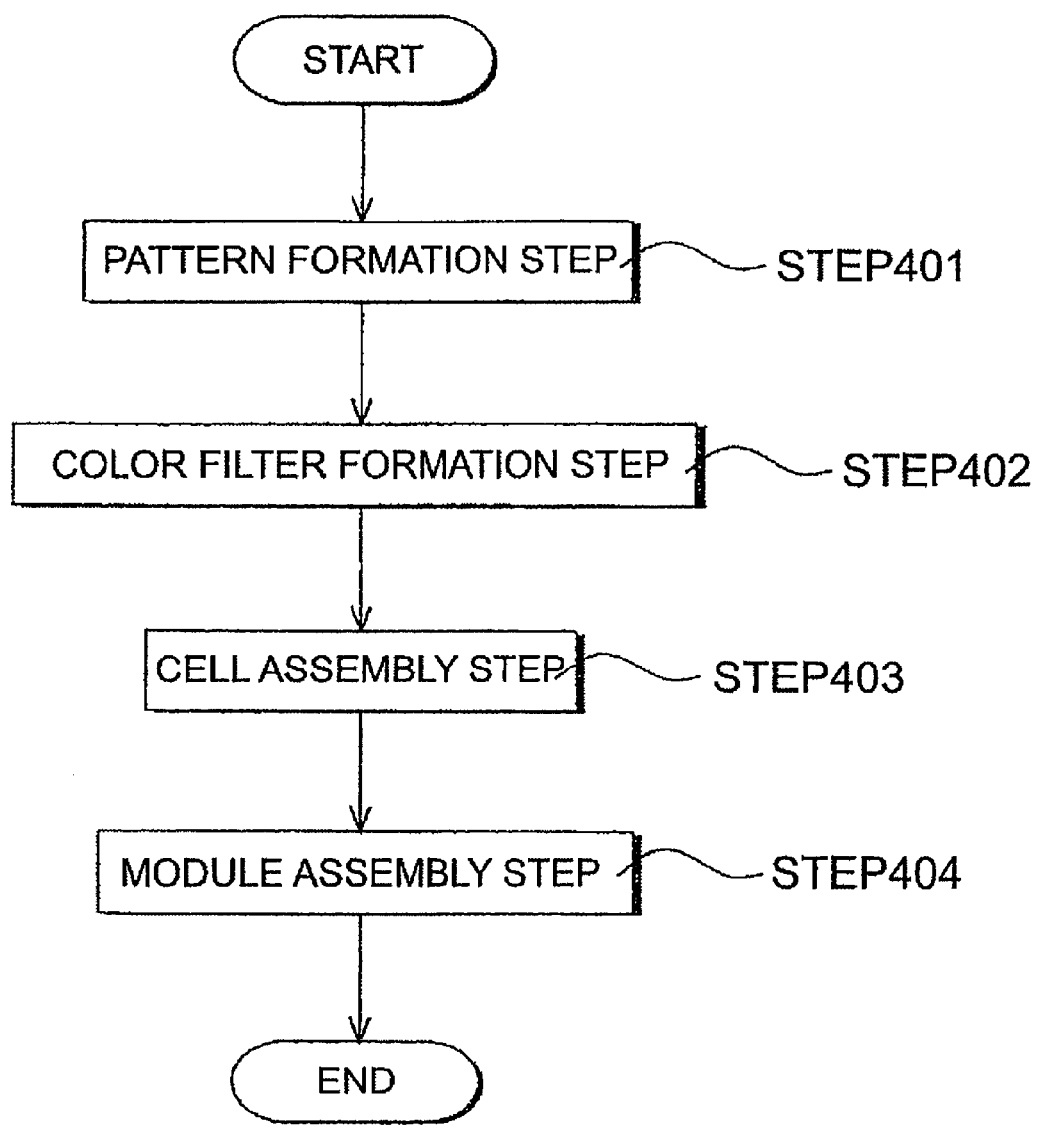
FIG. 12 is a flow chart showing a method when a liquid crystal display device is acquired as a micro-device.

In the exposure apparatus of the present embodiment, a liquid crystal display device, as a micro device, may be acquired by forming a predetermined pattern (e.g. circuit pattern, electrode pattern) on a plate (glass substrate). Now an example of this method will be described with reference to the flow chart in FIG. 12. In FIG. 12, a photolithography step, which transfers and exposes a pattern on a mask to a photosensitive substrate (glass substrate on which resist is coated) using the exposure apparatus of the present embodiment, is executed in the pattern formation step 401. By this photolithography step, a predetermined pattern including many electrodes is formed on the photosensitive substrate. Then the exposed substrate passes through each step of development step, etching step and resist stripping step, and as a result, a predetermined pattern is formed on the substrate, and processing moves to the next color filter formation step 402.

Then in the color filter formation step 402, many sets of three dots, corresponding to R (Red), G (Green) and B (Blue) are arrayed in a matrix, or a plurality of sets of three stripe filters, R, G and B, are arrayed in a horizontal scan line direction so as to form a color filter. After the color filter formation step 402, a cell assembly step 403 is executed. In the cell assembly step 403, a liquid crystal panel (liquid crystal cell) is assembled using the substrate having a predetermined pattern acquired in the pattern formation step 401 and the color filter acquired in the color filter formation step 402.

In the cell assembly step 403, liquid crystals are injected into an area between the substrate having a predetermined pattern acquired in the pattern formation step 401 and the color filter acquired in the color filter formation step 402, so as to manufacture the liquid crystal panel (liquid crystal cell). Then in a module assembly step 404, electric circuits for the assembled liquid crystal panel (liquid crystal cell) to perform display operation and each component, such as back light, are installed, and the liquid display device is completed. According to this manufacturing method for the liquid crystal display device, a liquid crystal display device having extremely fine circuit patterns can be acquired with good throughput.

In the above embodiment, an ArF excimer laser light source is used, but the present invention is not limited to this, and another appropriate light source, such as an $F_2$ laser light source, may also be used. If the $F_2$ laser light is used as the exposure light, fluorine-contained liquid, such as fluorine-contained oil and perfluoropolyether (PFPE), which can transmit $F_2$ laser light, is used as the liquid.

In the above embodiment, the present invention is applied to the immersion type projection optical system installed in the exposure apparatus, but the present invention is not limited to this, and can be applied to other general liquid immersion type projection optical systems.

In the above embodiment, the boundary lens Lb and the submerged plane parallel plate Lp are made from quartz, but the material for forming the boundary lens Lb and the submerged plane parallel plate Lp is not limited to quartz, and such crystal material as magnesium oxide, calcium oxide, strontium oxide and barium oxide, may be used.

Also in the above embodiment, pure water is used for the first liquid and second liquid, but the first liquid and second liquid are not limited to pure water, but water containing $H^+$, $Cs^+$, $K^+$, $Cl^-$, $SO_4^{2-}$, or $PO_4^{2-}$, isopropanol, glycerol, hexane, heptane or decane may be used.

| Explanation of Reference Symbols | |
|---|---|
| R | reticle |
| RST | reticle stage |
| PL | projection optical system |
| Lb | boundary lens |
| Lp | submerged plane parallel plate |
| Lm1, Lm2 | pure water (liquid) |
| W | water |
| 1 | illumination optical system |
| 9 | Z stage |
| 10 | XY stage |
| 12 | movable mirror |
| 13 | wafer laser interferometer |
| 14 | main control system |
| 15 | wafer stage drive system |
| 21 | first water supply/discharge mechanism |
| 22 | second water supply/discharge mechanism |

The invention claimed is:

1. A method of exposing an image of a first pattern, the method comprising:
  emitting a light onto the image of the first pattern set in a first plane that is above a photosensitive substrate set at a second plane;
  guiding the light, which passes through the first pattern and an optical surface, to form a second pattern in a surface of the photosensitive substrate;
  imaging an image of the second pattern through a liquid; and
  shielding a flare light generated in the optical surface at a position where an optical member contacts the liquid,
  wherein a condition of $0.25 < D/Ym \times \tan \Theta < 1.7$ is satisfied, where D is a space from the second plane to a position at which a shielding of the flare light start, $\Theta$ is a maximum incident angle of an image forming beam which reaches the second plane, and Ym is a maximum image height on the second plane.

2. The method according to claim 1, further comprising:
  preventing an entry of the liquid into an inside of an optical system guiding the light from the first pattern to the second plane through the optical surface.

3. The method according to claim 2, wherein the preventing comprises using a water repellent resin.

4. The method according to claim 3, wherein the shielding comprises shielding the flare light progressing to the water repellent resin.

5. The method according to claim 3, wherein the water repellent resin contacts the optical member which contacts the liquid.

6. The method according to claim 3, wherein the water repellent resin comprises a sealing member.

7. The method according to claim 5, wherein the water repellent resin comprises a water repellent functional film.

8. A method of manufacturing a device, comprising:
  setting a first pattern in a first plane;
  transferring and exposing the first pattern to set a second pattern in a surface of a photosensitive substrate set at a second plane;
  guiding a light from the first pattern to the second plane through an optical surface;
  imaging an image of the second pattern through a liquid;
  wherein a condition of $0.25 < D/Ym \times \tan \Theta < 1.7$ is satisfied, where D is a space from the second plane to a position at which a shielding of the flare light start, $\Theta$ is a maximum incident angle of an image forming beam which reaches the second plane, and Ym is a maximum image height on the second plane;
  developing the photosensitive substrate on which the first pattern is transferred to form a mask layer having a shape corresponding to the second pattern; and
  processing the surface of the photosensitive substrate using the mask layer.

9. The method according to claim 8, further comprising:
  preventing an entry of the liquid into an inside of an optical system guiding the light from the first pattern to the second plane through the optical surface.

10. The method according to claim 9, wherein the preventing comprises using a water repellent resin.

11. The method according to claim 10, the method further comprising shielding a flare light progressing to the water repellent resin.

12. The method according to claim 10, wherein the water repellent resin contacts an optical member which contacts the liquid.

13. The method according to claim 12, wherein the water repellent resin comprises a sealing member.

14. The method according to claim 12, wherein the water repellent resin comprises a water repellent functional film.

* * * * *